US006440174B1

(12) United States Patent
Usui et al.

(10) Patent No.: US 6,440,174 B1
(45) Date of Patent: *Aug. 27, 2002

(54) PIEZO-ELECTRIC/ELECTROSTRICTIVE FILM TYPE CHIP

(75) Inventors: Minoru Usui, Shiojiri; Takahiro Katakura, Okaya; Fujio Akahane, Minamiazumi-gun; Kazumi Kamoi; Satoshi Shinada, both of Shiojiri; Yukihisa Takeuchi, Nishikamo-gun; Nobuo Takahashi, Owariasahi, all of (JP)

(73) Assignees: Seiko Epson Corporation; NGK Insulators, Ltd., both of (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 731 days.

(21) Appl. No.: 08/809,042

(22) PCT Filed: Jul. 23, 1996

(86) PCT No.: PCT/JP96/02054

§ 371 (c)(1), (2), (4) Date: Mar. 7, 1997

(87) PCT Pub. No.: WO97/03836

PCT Pub. Date: Feb. 6, 1997

(30) Foreign Application Priority Data

Jul. 24, 1995 (JP) ............................................. 7-208397
Nov. 8, 1995 (JP) ............................................. 7-290153

(51) Int. Cl.$^{7}$ ................................................ H01L 41/08

(52) U.S. Cl. ............................ 310/328; 347/68; 347/70

(58) Field of Search ......................... 310/328, 330–332; 347/68–71

(56) References Cited

U.S. PATENT DOCUMENTS 4,752,789 A 6/1988 Maltsev ....................... 346/140
5,255,016 A * 10/1993 Usui et al. .............. 310/330 X
5,381,171 A * 1/1995 Hosono et al. ............... 347/72
5,512,793 A * 4/1996 Takeuchi et al. ............ 310/328
5,617,127 A * 4/1997 Takeuchi et al. .............. 347/71

FOREIGN PATENT DOCUMENTS

EP 0 572 231 A2 12/1993

(List continued on next page.)

OTHER PUBLICATIONS

Patent Abstracts of Japan, vol. 13, No. 52 (M–794), Feb. 7, 1989 & JP 63 256453 A (Seiko Epson Corp.), Oct. 24, 1988, *abstract*.

(List continued on next page.)

*Primary Examiner*—Mark O. Budd
(74) *Attorney, Agent, or Firm*—Parkhurst & Wendel, L.L.P.

(57) ABSTRACT

A piezo-electric/electrostrictive film type chip (50) includes: a ceramic substrate (70) having a spacer plate (74) having a windows-disposed pattern (100) having a plurality of window portions (75) and a thin closure plate (72) for closing the window portions (75) which is unitarily connected with the spacer plate; and a piezo-electric/electrostrictive working portion (71) having a lower electrode (81), a piezo-electric/electrostrictive layer (82), and an upper electrode (83), each being formed in the form of a layer and laminated in this order at a closure portion of the window (75) on the outer surface of the closure plate (72) by a film formation method. A pin hole (52) for positioning is formed in or near the center of gravity of the windows-disposed pattern (100). Deterioration of positional preciseness of the pin hole and a through hole of the piezo-electric/electrostrictive actuator can be minimized, and the piezo-electric/electrostrictive actuator can be unitarily connected with an ink nozzle member with high positional preciseness.

3 Claims, 5 Drawing Sheets

FOREIGN PATENT DOCUMENTS

| | | | |
|---|---|---|---|
| EP | 0 600 743 | A3 | 6/1994 |
| EP | 0 600 743 | A2 | 6/1994 |
| JP | 63-256453 | | 10/1988 |
| JP | 3-45812 | | 9/1991 |
| JP | 6-336012 | | 12/1994 |

OTHER PUBLICATIONS

Patent Abstracts of Japan, vol. 18, No. 620 (M–1711), Nov. 25, 1994 & JP 06 238895 A (Seiko Epson Corp.), Aug. 30, 1994, *abstract*.

Patent Abstracts of Japan, vol. 15, No. 318 (M–1146), Aug. 14, 1991 & JP 03 118159 A (Nitsukooshi KK), May 20, 1991, *abstract*

* cited by examiner

PRIOR ART

PRIOR ART

PIEZO-ELECTRIC/ELECTROSTRICTIVE FILM TYPE CHIP

TECHNICAL FIELD

The present invention relates to a piezo-electric/electrostrictive film type chip, which is an integrated body of piezo-electric/electrostrictive film type elements. More specifically, the present invention relates to a piezo-electric/electrostrictive film type chip which is suitably applicable to an ink-jet print head.

BACKGROUND ART

In recent years, as one of mechanisms for increasing a pressure in a pressurizing room formed in a substrate, a piezo-electric/electrostrictive film type element is known in which a volume of the pressurizing room is changed by a displacement of a piezo-electric/electrostrictive working portion formed on a wall of the pressurizing room. Such a piezo-electric/electrostrictive film type element has been used as an ink pump of a print head used for an ink-jet printer, or the like, which has a mechanism of supplying an ink into a pressurizing room and filling the pressurizing room with an ink, increasing a pressure of the pressurizing room by a displacement of a piezo-electric/electrostrictive working portion, thereby an ink fine powder is expelled from a nozzle hole connected to the pressurizing room so as to print letters.

FIG. 4 shows one embodiment of an ink-jet print head (one portion) in which the conventional and known piezo-electric/electrostrictive film type element is used as an actuator. The ink-jet print head was formed by unitarily connecting a piezo-electric/electrostrictive film type chip 10 consisting of a plurality of piezo-electric/electrostrictive actuators 20 and an ink nozzle member 11 having a plurality of nozzle holes 12 each corresponding to each of the plurality of piezo-electric/electrostrictive actuators 20. Ink supplied to pressurizing rooms 30 formed in piezo-electric/electrostrictive actuators 20 is expelled through nozzle holes 12 arranged in an ink nozzle member 11.

The ink nozzle member 11 includes a thin and plane nozzle plate 13 provided with a plurality of nozzle holes 12, a thin and plane orifice plate 15 provided with a plurality of orifice holes 14. The nozzle plate 13 and the orifice plate 15 are laminated so as to sandwich a flow path plate 16 and connected by an adhesive, or the like, so as to have a unitary structure. Inside the ink nozzle member 11, there are formed flow paths 17 for expelling ink which introduces the ink into nozzle holes 12 and flow paths 18 for supplying ink which introduces the ink into the orifice holes 14. Incidentally, the ink nozzle member 11 is usually made of plastic or metal.

The piezo-electric/electrostrictive actuator 20 includes a ceramic substrate 21 and a piezo-electric/electrostrictive working portion 22 unitarily formed in the ceramic substrate 21. The ceramic substrate 21 has a unitary structure in which a thin and plane closure plate 23 and a connecting plate 24 are laminated with a spacer plate 25 sandwiched therebetween. In the connecting plate 24 are formed a first through opening 26 and a second through opening 27 each corresponding to an orifice hole 14 formed in the orifice plate 15 of the ink nozzle member 11.

In the spacer plate 25 are formed a plurality of window portions 28. The spacer plate 25 is laminated on the connecting plate 24 so that the first through opening 26 and the second through opening 27 arranged in the connecting plate 24 correspond to each of the window portions 28. On the other side of the spacer plate 25 opposite to the side of the connecting plate 24, the closure plate 23 is superposed, and the openings of the window portions 28 are closed by the closure plate 23.

Thus, pressurizing rooms 30 are formed in the ceramic substrate 21.

On the outer surface of the closure plate 23 of the ceramic substrate 21, each of the piezo-electric/electrostrictive working portion 22 is arranged on positions corresponding to each of the pressurizing rooms 30. Here, the piezo-electric/electrostrictive working portion 22 consists of a lower electrode 31, a piezo-electric/electrostrictive layer 32, and an upper electrode 33.

An ink-jet print head is formed by unitarily connecting a piezo-electric/electrostrictive film type chip 10 and an ink nozzle member 11. When an ink-jet print head is unitarily formed, throughholes such as the first through opening 26 and the second through opening 27 formed in the piezo-electric/electrostrictive actuator 20 and throughholes such as a plurality of orifice holes 14 in an ink nozzle member 11 should keep a relation of accurate positions.

In such a unitary connection of the piezo-electric/electrostrictive film type chip 10 and the ink nozzle member 11, a pin hole 42 has been conventionally formed around an edge portion of the piezo-electric/electrostrictive film type chip 10 as shown in FIG. 5. A constructing pin (not shown) is inserted to the pin hole 42 for an absolute positioning so as to connect the piezo-electric/electrostrictive film type chip 10 to the ink nozzle member 11. Incidentally, 43 denotes an auxiliary hole into which an auxiliary pin (not shown) is inserted so as to avoid rotational slippage between the piezoelectric/electrostrictive film type chip 10 and the ink nozzle member 11.

However, demands of improving resolution and printing speed ability of an ink-Jet printer have been further increasing in recent years. As a result, as the degree of integration of a piezo-electric/electrostrictive film type chip 10 is increased, many nozzles are required. Along with the demand, enlargement of a piezo-electric/electrostrictive film type chip 10 has been further required. According to the enlargement of a piezoelectric/electrostrictive film type chip 10, a problem has arisen because the preciseness of positions of the pin hole 42 and a throughhole of the piezo-electric/electrostrictive actuator 20 deteriorates because the distance between the pin hole 42 and, the piezo-electric/electrostrictive actuator 20 located furthermost from the pin hole 42 is elongated when the pin hole 42 is formed in the edge portion of a piezo-electric/electrostrictive film type chip 10. This is because a ceramic substrate 21 is formed by a method including the steps of molding a ceramic green sheet, punching, laminating, unitarily firing, and therefore, a firing shrinkage of about 20% of a ceramic varies depending on the parts, which makes an absolute value of a variance large as the piezo-electric/electrostrictive film type chip 10 is enlarged.

Therefore, an object of the present invention is to provide a piezo-electric/electrostrictive film type chip, in which deterioration of preciseness of positions of a pin hole and a throughhole of a piezo-electric/electrostrictive actuator is minimized and which can be precisely connected with an ink nozzle member.

DISCLOSURE OF THE INVENTION

That is to say, according to the present invention, there is provided a piezo-electric/electrostrictive film type chip comprising:

a ceramic substrate having a spacer plate having a windows-disposed pattern comprising at least a plurality of window portions and a thin closure plate for closing the window portions that is unitarily connected with the spacer plate; and a piezo-electric/electrostrictive working portion having a lower electrode, a piezo-electric/electrostrictive layer, and an upper electrode, each being formed in the form of a layer and laminated in this order at a closure portion of the window on the outer surface of the closure plate by a film formation method;

wherein a pin hole for positioning is formed in or near the center of gravity of the windows-disposed pattern.

A shortest distance A between window portions of the spacer plate and a pin hole for positioning preferably satisfies the formula $0.5\times t \leqq A$ (t: thickness of the spacer plate). In this case, t is preferably 0.5 mm or less.

Incidentally, a spacer plate is not a green sheet but a virtual portion specified by drawing a virtual line on a completed piezo-electric electrostrictive film type chip as shown in FIG. 4.

BEST MODE FOR CARRYING OUT THE INVENTION

Next, a piezo-electric/electrostrictive film type chip of the present invention will be described, referring to drawings.

Figure 1:
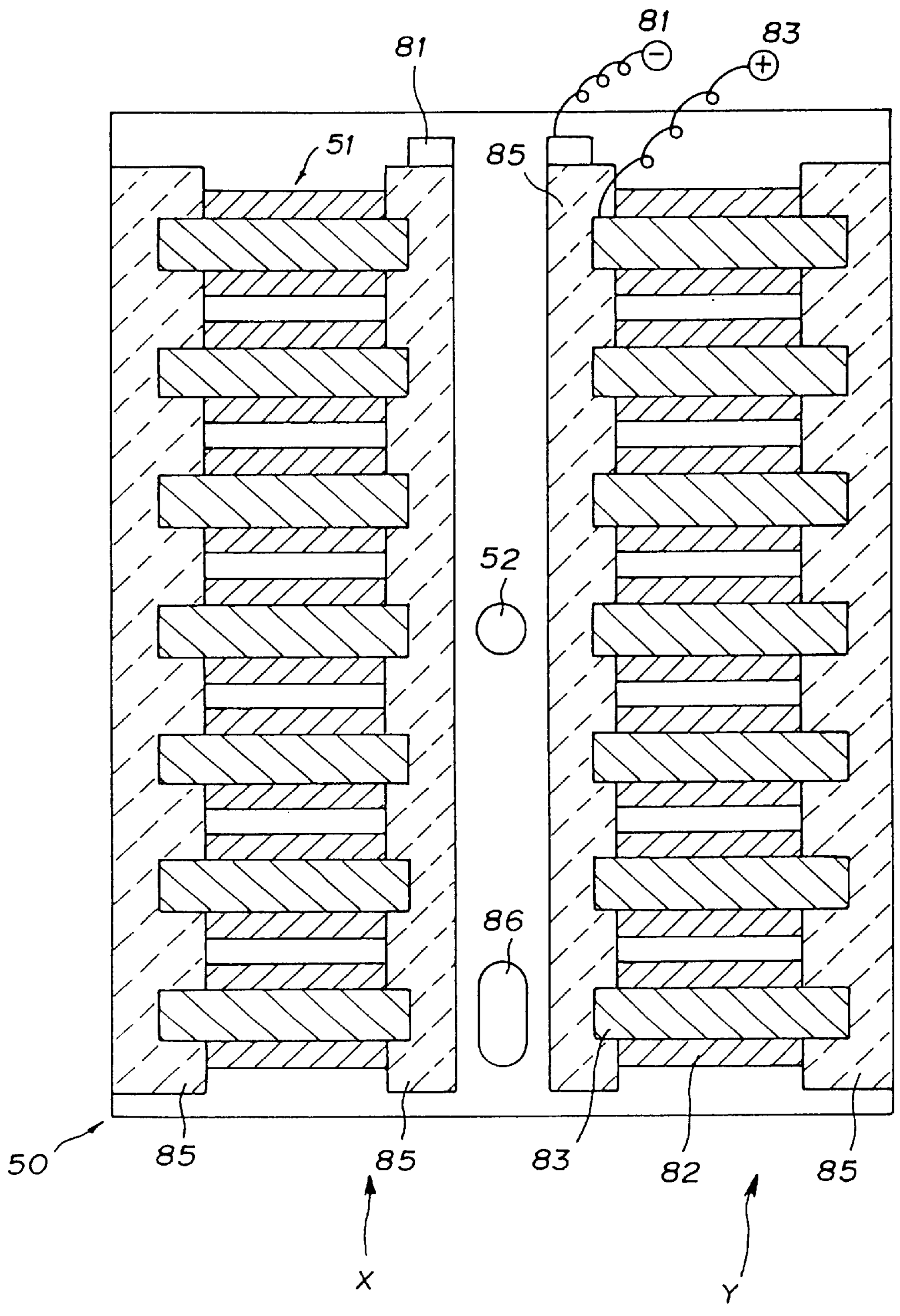
FIG. 1 is a schematic plan view showing an embodiment of a piezo-electric/electrostrictive film type chip of the present invention.
Figure 2:
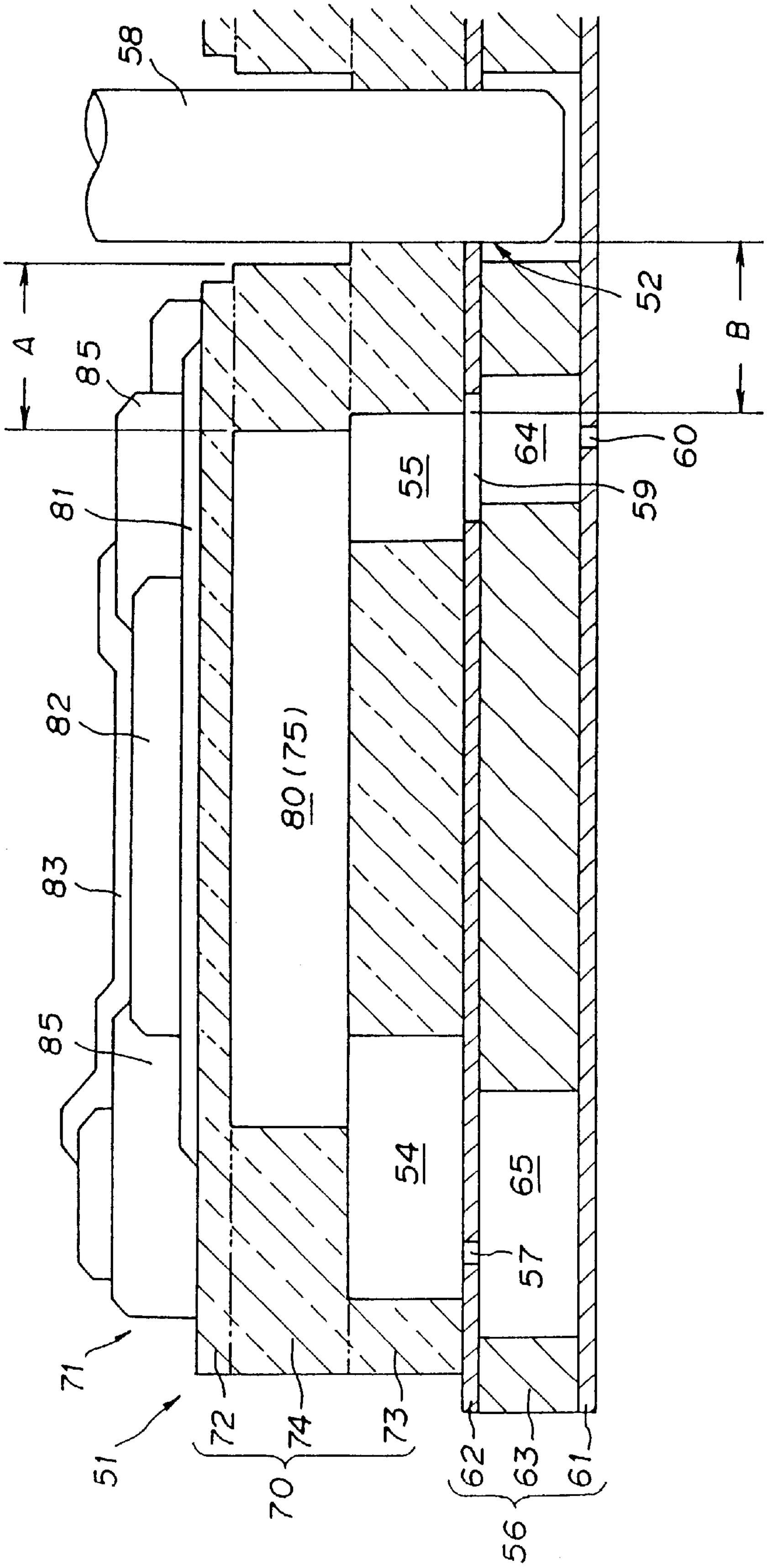
FIG. 2 is a cross-sectional explanatory view showing an embodiment of a nozzle portion of an ink-jet print head.

FIG. 1 is a schematic plan view showing an embodiment of a piezo-electric/electrostrictive film type chip of the present invention. FIG. 2 is a cross-sectional explanatory view showing an embodiment of a nozzle portion of an ink-jet print head. A piezo-electric/electrostrictive film type chip 50 is formed by integrating a numerous number of piezo-electric/electrostrictive actuators 51. A pin hole 52 for positioning is formed in or near the center of gravity of a windows-disposed pattern of the piezo-electric/electrostrictive film type chip 50. As shown in FIG. 2, the pin hole 52 for positioning is formed so as to precisely position a first through opening 54 and a second through opening 55 in a piezo-electric/electrostrictive actuator 51 and a plurality of orifice holes 57 in an ink nozzle member 56 and simultaneously connect the piezo-electric/electrostrictive actuator 51 with the ink nozzle member 56. Specifically, a constructing pin 58 is inserted into the pin hole 52 for positioning and connecting.

When the piezo-electric/electrostrictive actuator 51 and the ink nozzle member 56 are connected to each other with the positioning by inserting a constructing pin 58 into the pin hole 52 formed in or near the center of gravity of a windows-disposed pattern of the piezo-electric/electrostrictive film type chip 50, a distance between the pin hole 52 and a piezo-electric/electrostrictive actuator 51 located in the furthermost portion is short in comparison with a conventional one even if the piezo-electric/electrostrictive film type chip 50 is enlarged. Therefore, deterioration of positional preciseness of the pin hole 52, the first and the second through openings 54 and 55 of a piezo-electric/electrostrictive actuator 51, and a plurality of orifice holes 57 which are throughholes in the ink nozzle member 56 is minimized, and the piezo-electric/electrostrictive actuator 51 can be unitarily connected with the ink nozzle member 56 with high positional preciseness.

The ink nozzle member 56 has a structure in which a thin and plane nozzle plate 61 provided with a plurality of nozzle holes 60 and a thin planar orifice plate 62 provided with a plurality of orifice holes 57 sandwich a flow path plate 63, which are unitarily connected by an adhesive, or the like. Inside the ink nozzle member 56 is formed a flow path 64 for expelling ink which introduces ink into a nozzle hole 60 and a flow path 65 for supplying ink to the orifice holes 57. The ink nozzle member 56 is made of metal, plastic, or the like.

Figure 4:
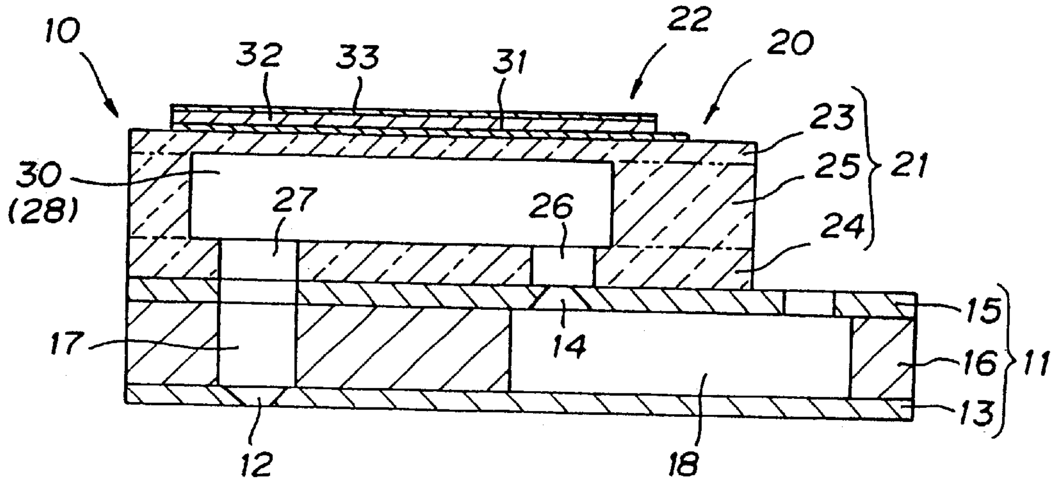
FIG. 4 is a cross-sectional view showing an embodiment of an ink-jet print head (one portion) in which a conventionally known piezo-electric/electrostrictive film type element is used as an actuator.

The piezo-electric/electrostrictive actuator 51 includes a ceramic substrate 70 and a piezo-electric/electrostrictive working portion 71 which is unitarily formed on the ceramic substrate 70. The ceramic substrate 70 is unitarily formed by putting a spacer plate 74 between a thin and plane closure plate 72 and a thin and plane connecting plate 73. In the connecting plate 73, a first through opening 54 and a second through opening 55 are formed in positions corresponding to an orifice hole 57 and a ink flow pass hole 59, respectively, which are formed in an orifice plate 62 in the similar manner as in FIG. 4.

In the spacer plate 74 are formed a plurality of window portions 75. The spacer plate 74 is laminated on the connecting plate 73 so that the first through opening 54 and the second through opening 55 of the connecting plate 73 are opened toward each of the window portions 75. On the surface of spacer plate 74 opposite to the side of the connecting plate 73 is laminated a closure plate 72, which closes openings of window portions 75, thereby forming pressurizing rooms 80 inside the ceramic substrate 70.

On the outer surface of the closure plate 72 of the ceramic substrate. 70 is formed a piezo-electric/electrostrictive working portion 71 at the site corresponding to the pressurizing room 80. The piezo-electric/electrostrictive working portion 71 consists of a lower electrode 81, a piezo-electric/electrostrictive layer 82, and an upper electrode 83. In Examples shown in FIGS. 1 and 2, in both ends of the piezo-electric/electrostrictive layer 82, a glass layer 85 is provided so as to cover the outer surface of the closure plate 72 and/or the outer surface of the lower electrode 81. Incidentally, in FIG. 1, a lower electrode 81 is commonly placed in regions X and Y, where a predetermined number of piezo-electric/electrostrictive actuators 51 are put side by side with one another. Similarly, a glass layer 85 commonly covers piezo-electric/electrostrictive actuators 51 in each of the regions X and Y.

Figure 3:
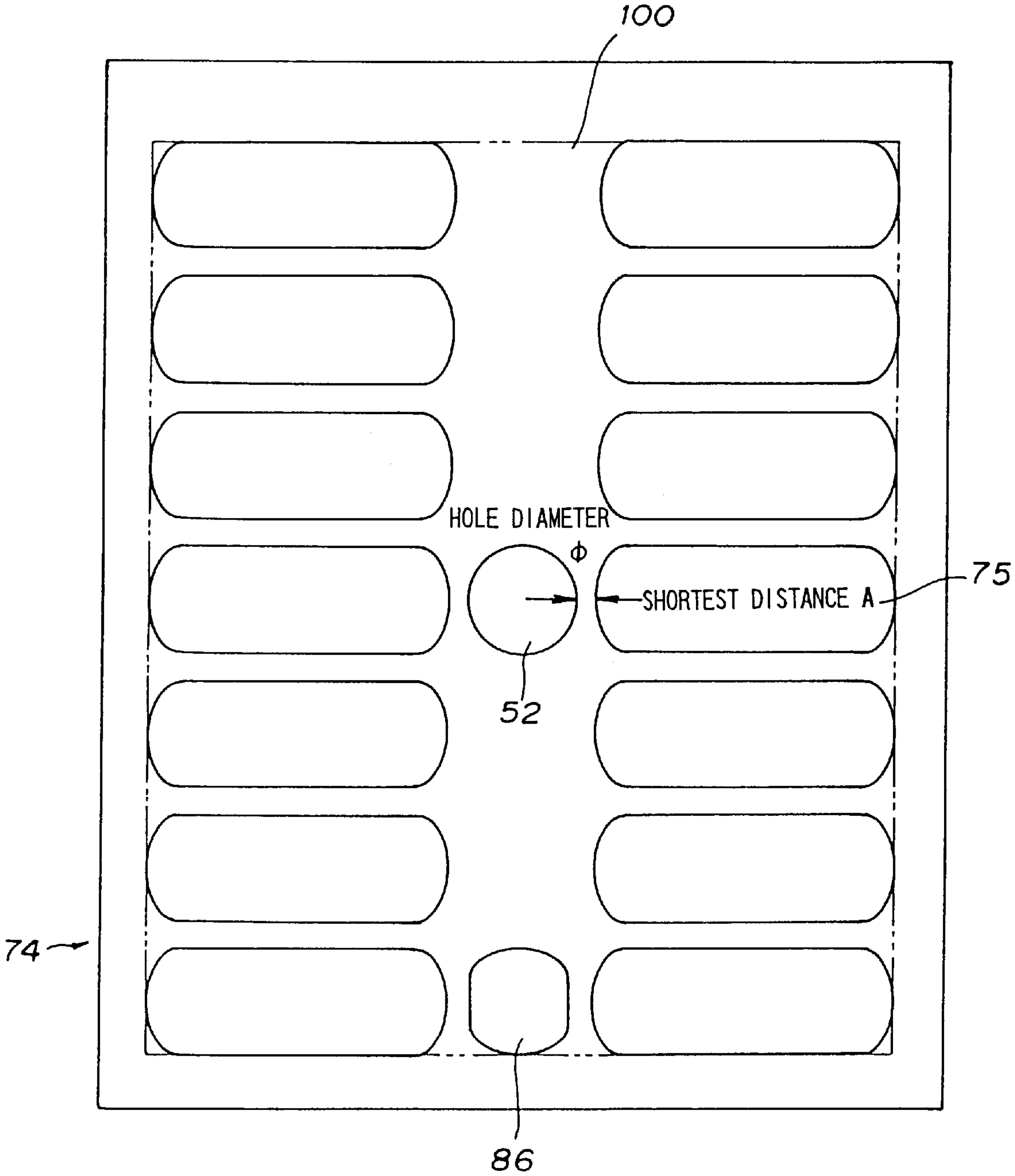
FIG. 3 is an explanatory view showing a positional relation between a pin hole and window portions in a spacer plate.

In the present invention, when a pin hole 52 for positioning is formed in or near the center of gravity of a windows-disposed pattern of the piezo-electric/electrostrictive film type chip 50, as shown in FIG. 3, a shortest distance A between the pressurizing room 80 formed inside the ceramic substrate 70 (i.e., a window portion 75 of a spacer plate 74 in FIG. 2) and the pin hole 52 preferably satisfies $0.5\times t \leqq A$ (t: thickness of the spacer plate 74) in view of avoiding a defect of a product as the piezo-electric/electrostrictive film type chip 50.

When A is small and outside the range of the formula, a mechanical impact caused when the constructing pin 58 for positioning is inserted into the pin hole 52 for positioning is directly or indirectly given to the portion of the 12 shortest distance, thereby rapidly increasing possibility of causing a defect such as breakage and chipping off.

As shown in FIG. 2, there is a possibility that a shortest distance B between a pin hole 52 for positioning and a second through opening 55 in a connecting plate 73 is smaller than the aforementioned A because of design. However, since the second through opening 55 has a round opening plane shape, a stress balance is superior to a window portion having an oval shape. It may be the reason for the dependence of breakage or chipping off on the aforementioned condition of A even if A is larger than B.

Figure 5:
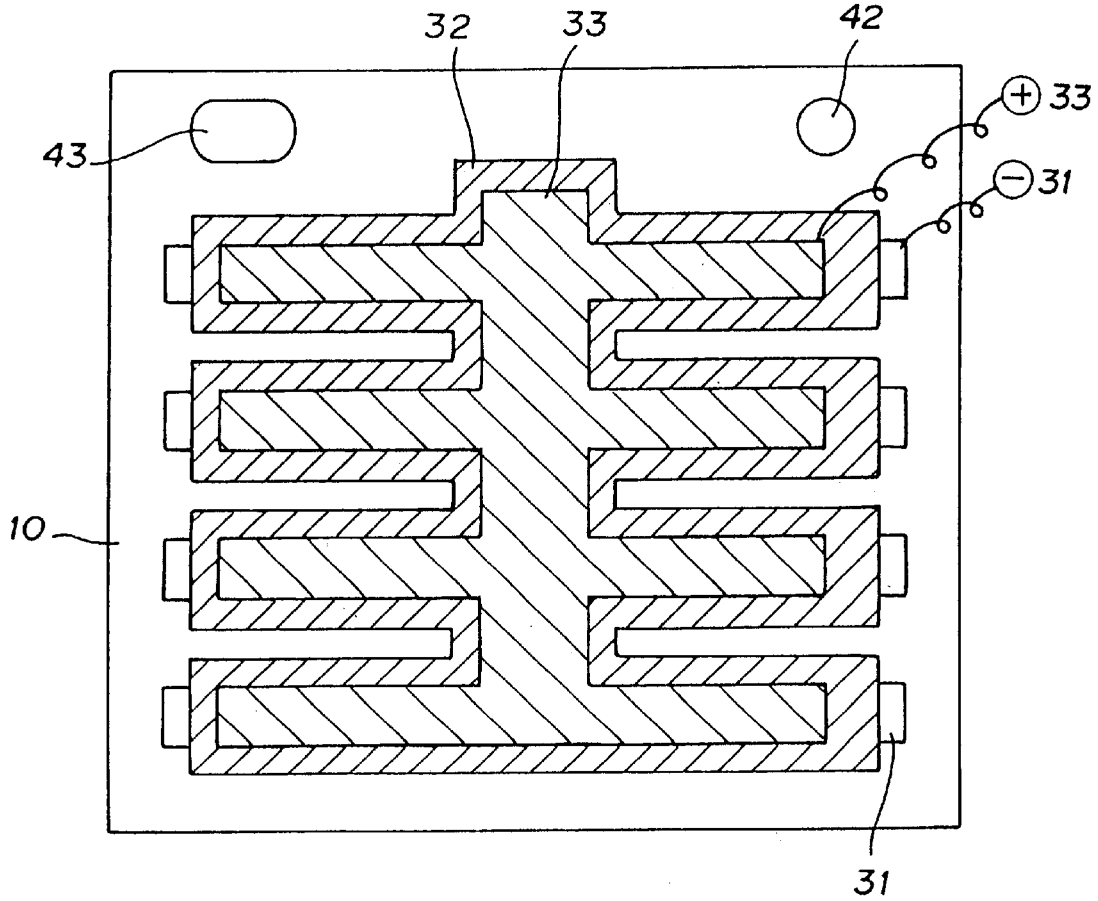
FIG. 5 is an explanatory plan view showing a conventional piezo-electric/electrostrictive film type chip.

In the present invention an auxiliary hole 86 is formed as shown in FIGS. 1 and 3 in the similar manner as an auxiliary hole 43 shown in FIG. 5.

Incidentally, as shown in FIG. 3, a windows-disposed pattern 100 relates to a plane disposition of windows in a spacer plate 74 and means a polygon having a least number of angles and including all window portions in the spacer plate 74.

The pin hole for positioning is most preferably located in the center of gravity. However, when the position is occupied with another important functional part, "the portion near the center of gravity" means a portion apart from the important functional part and within a range as near as possible to the center of gravity.

Incidentally, in this case, the spacer plate 74 preferably has a thickness of 0.5 mm or less.

In the present invention, the ceramic substrate 70 is formed as a unitarily fired ceramic article. Specifically, a green sheet is molded with a general apparatus such as a doctor blade apparatus using a ceramic slurry made from a ceramic material, a binder, a solvent, and the like. Then, as necessary, the green sheet is subjected to machining such as cutting, punching, or the like, and forming window portions 75, the first through opening 54, the second through opening 55, and the like, so as to form precursors of plates 72, 73, and 74. The precursors are laminated and fired so as to obtain a unitary ceramic substrate 70.

A material for the ceramic substrate 70 is not particularly limited. However, alumina or zirconia is suitably used in view of moldability, or the like. The closure plate 72 preferably has a thickness of 50 μm or less, a connecting plate 73 preferably has a thickness of 10 μm or more, and a spacer plate 74 preferably has a thickness of 50 μm or more and 500 μm or less as mentioned above.

A piezo-electric/electrostrictive working portion 71 is constituted of a lower electrode 81, a piezo-electric/electrostrictive layer 82, and an upper electrode 83 on the closure plate 72. The piezo-electric/electrostrictive working portion 71 is usually formed by a film formation method.

That is, the lower electrode 81, the piezo-electric/electrostrictive layer 82, and the upper electrode 83 are formed on the outer surface of the closure plate 72 by a known film formation method, for example, a thick film formation method such as screen printing or spray, or a thin film formation method such as ion beam, sputtering or CVD.

The thus formed respective films (the lower electrode 81, the piezo-electric/electrostrictive layer 82, and the upper electrode 83) are next subjected to a heat treatment (firing), but this heat treatment may be carried out after formation of each film, or it may be done simultaneously for these films after the formation of all the films.

No particular restriction is put on the material of the lower electrode 81 and the upper electrode 83 which constitute the piezo-electric/electrostrictive working portion 71, and any material can be used, so long as it is a conductive material which can withstand a high-temperature oxidizing atmosphere in the vicinity of a heat treatment (firing) temperature, and for example, single metals and alloys are usable. Additionally, conductive ceramics are also usable. Typical and suitable examples of the conductive material include high-melting noble metals such as platinum, gold, or palladium.

No particular restriction is put on the material of the piezo-electric/electrostrictive layer 82 which constitutes the piezo-electric/electrostrictive working portion 71, and any material can be used, so long as it is a material which can exert an electrical field inducing strain such as a piezo-electric effect or an electrostrictive effect. Typical and preferably usable examples of this material include a material mainly comprising lead titanate zirconate (PZT system), a material mainly comprising magnesium-lead niobate (PMN system) and nickel-lead niobate (PNN system).

The thickness of the piezo-electric/electrostrictive working portion 71 is usually 100 μm or less, and the thickness of the lower electrode 81 and the upper electrode 83 is usually 20 μm or less, preferably 5 μm or less. Furthermore, the thickness of the piezo-electric/electrostrictive layer 82 is preferably 50 μm or less, more preferably in the range from 3 μm to 40 μm in order to obtain a large displacement at a low operation voltage.

The embodiments of the present invention has been described above in detail, but needless to say, the present invention should not be limited by these embodiments at all. In addition, it should be understood that, besides the aforementioned embodiments, various changes, modifications, improvements, or the like, can be given to the present invention, so long as they do not deviate from the gist of the present invention.

Industrial Applicability

As described above, according to the piezo-electric/electrostrictive film type chip of the present invention, a pin hole for positioning is formed in or near the center of gravity of a windows-disposed pattern of a piezo-electric/electrostrictive film type chip, and therefore, when the connection is conducted with positioning using the pin hole, there is obtained a remarkable effect that the piezo-electric/electrostrictive actuator can be unitarily connected with an ink nozzle member with high positional preciseness because a distance between the pin hole and a piezo-electric/electrostrictive actuator which is located in the furthermost portion is shorter than a conventional one even if a piezo-electric/electrostrictive film type chip is enlarged, thereby minimizing deterioration of positional preciseness of the pin hole and a throughhole of the piezo-electric/electrostrictive actuator.

What is claimed is:

1. A piezo-electric/electrostrictive film type chip comprising:

a ceramic substrate having a spacer plate having a windows-disposed pattern comprising at least a plurality of window portions and a thin closure plate for closing the window portions which is unitarily connected with the spacer plate, said window portions and closure plate forming pressurizing rooms;

a plurality of piezo-electric/electrostrictive working portions each including a laminate of a lower electrode, a piezo-electric/electrostrictive layer, and an upper electrode and each being disposed at a closure portion of each window on the outer surface-of the closure plate, all of said working portions being disposed in a single plane; and a pin hole for positioning disposed in or near the center of gravity of the windows-disposed pattern, the pin hole (i) being separated from said pressurizing rooms and (ii) extending in a direction perpendicular to said plane.

2. A piezo-electric/electrostrictive film type chip according to claim 1, wherein a shortest distance A between window portions of the spacer plate and the pin hole for positioning satisfies: $0.5 \times t \leqq A$, wherein t is a thickness of the spacer plate.

3. A piezo-electric/electrostrictive film type chip according to claim 1, wherein the spacer plate has a thickness of 0.5 mm or less.

* * * * *